(12) United States Patent
Abali et al.

(10) Patent No.: US 10,715,174 B1
(45) Date of Patent: Jul. 14, 2020

(54) REDUCING LATCH COUNT TO SAVE HARDWARE AREA FOR DYNAMIC HUFFMAN TABLE GENERATION

(71) Applicant: International Business Machines Corporation, Armonk, NY (US)

(72) Inventors: Bulent Abali, Tenafly, NJ (US); Ashutosh Misra, Lagrangeville, NY (US); Suneel Pusarla, Rajam (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/751,737

(22) Filed: Jan. 24, 2020

Related U.S. Application Data

(63) Continuation of application No. 16/275,608, filed on Feb. 14, 2019.

(51) Int. Cl.
*H03M 7/30* (2006.01)
*H03M 7/40* (2006.01)
*G06F 5/01* (2006.01)

(52) U.S. Cl.
CPC .......... *H03M 7/3086* (2013.01); *G06F 5/012* (2013.01); *H03M 7/40* (2013.01)

(58) Field of Classification Search
CPC ........ H03M 7/3086; H03M 7/40; G06F 5/012
USPC ............................... 341/51, 67, 87
See application file for complete search history.

(56) References Cited

U.S. PATENT DOCUMENTS

| | | | |
|---|---|---|---|
| 5,748,121 A | 5/1998 | Romriell | |
| 6,040,790 A | 3/2000 | Law | |
| 7,307,552 B2 | 12/2007 | Ma et al. | |
| 7,358,870 B2 | 4/2008 | Bay | |
| 7,538,696 B2 * | 5/2009 | Laker | H03M 7/3086 341/50 |
| 7,609,182 B2 | 10/2009 | Owsley et al. | |
| 8,766,827 B1 | 7/2014 | Milne et al. | |
| 9,030,771 B2 | 5/2015 | Hostetter | |
| 9,176,977 B2 | 11/2015 | Droege et al. | |
| 9,362,948 B2 * | 6/2016 | Kuila | H03M 7/40 |

(Continued)

FOREIGN PATENT DOCUMENTS

| | | |
|---|---|---|
| EP | 3093999 A1 | 11/2016 |
| EP | 3152840 A1 | 4/2017 |

OTHER PUBLICATIONS

Bulent, Abali et al., "Reducing Latch Count to Save Hardware Area for Dynamic Huffman Table Generation"; U.S. Appl. No. 16/275,608, filed Feb. 14, 2019.

(Continued)

*Primary Examiner* — Khai M Nguyen
(74) *Attorney, Agent, or Firm* — Cantor Colburn LLP; William Kinnaman

(57) ABSTRACT

Embodiments of the invention are directed to a DEFLATE compression accelerator and to a method for reducing a latch count required for symbol sorting when generating a dynamic Huffman table. The accelerator includes an input buffer and a Lempel-Ziv 77 (LZ77) compressor communicatively coupled to an output of the input buffer. The accelerator further includes a Huffman encoder communicatively coupled to the LZ77 compressor. The Huffman encoder includes a bit translator. The accelerator further includes an output buffer communicatively coupled to the Huffman encoder.

20 Claims, 7 Drawing Sheets

(56) References Cited

U.S. PATENT DOCUMENTS

| | | | |
|---|---|---|---|
| 9,577,665 | B2 | 2/2017 | Wu |
| 9,832,287 | B2 | 11/2017 | Sjoholm et al. |
| 9,929,748 | B1 | 3/2018 | Gopal et al. |
| 10,135,463 | B1 | 11/2018 | Satpathy et al. |
| 2006/0285756 | A1 | 12/2006 | Sugita |
| 2011/0307748 | A1 | 12/2011 | Laisne |
| 2016/0336959 | A1 | 11/2016 | Henry |

OTHER PUBLICATIONS

Garcia, et al., "Variant of Huffman coding and decoding using words frequencies to improve the compression ratio," ResearchGate: https://www.researchgate.net/publication/258840094; dowloaded Feb. 8, 2014; 9 pages.

Gupta et al., "Deep Learning with Limited Numerical Precision", Proceedings of the 32 nd International Conference on Machine Learning, Lille, France, 2015. JMLR: W&CP vol. 37, Copyright 2015 by the author(s), 10 pps.

List of IBM Patents or Patent Applications Treated as Related; Date Filed: Jan. 24, 2020, 2 pages.

Slegel et al., "Verifying the Correctness of a Deflate Compression Accelerator," U.S. Appl. No. 16/353,527, filed Mar. 14, 2019.

Slegel et al., "Verifying the Correctness of a Deflate Compression Accelerator," U.S. Appl. No. 16/741,974, filed Jan. 14, 2020.

Slegel et al., "Verifying the Correctness of a Deflate Compression Accelerator," U.S. Appl. No. 16/741,977, filed Jan. 14, 2020.

"Application Note//Hardware GZIP Decompression", Internet Citation, Jan. 1, 2003 (Jan. 1, 2003), pp. 1-11, XP002758725, Retrieved from the Internet: URL:http://www.mcs.anl.ogv/hereld/PXRF/CeloxicaTraining/GZIP%20App%20Note.pdf[tretrieved on Jun. 14, 2016] section Huffman encoding (for LZ77 output).

Fowers Jeremy et al., "A Scalable High-Bandwidth Archtecture for Lossless Compression on FPGAs", 2015 IEEE 23rd Annual International Symposium on Field-Programmable Custom Computing Machines, IEEE, May 2, 2015 (May 2, 2015), pp. 52-59, XP033177122, DOI: 10.1109/FCCM.2015.46 [retrieved on Jul. 15, 2015].

Hashemian R: "Condensed Table of Huffman Coding, a New Approach to Efficient Decoding", IEEE Transactions on Communications, IEEE Service Center, Piscataway, NJ. USE, vol. 52, No. 1, Jan. 1, 2004 (Jan. 1, 2004), pp. 6-8, XP011106827, ISSN: 0090-6778, DOI: 10.1109/TCOMM.2003.822145, Section III.

Klein S. T., et al., "Huffman Coding with Non-Sorted Frequencies", Data Compression Conference, 2008. DCC 2008, IEEE, Piscataway, NJ, USE, Mar. 25, 2008 (Mar. 25, 2008), p. 526, XP031241232, ISBN: 978-0-7695-3121-2.

Notification of Transmittal of the International Search Report and the Written Opinion of the International Searching Authority, or the Declaration, issued in International Patent Application No. PCT/EP2020/053409, dated Apr. 23, 2020; 14 pages.

\* cited by examiner

REDUCING LATCH COUNT TO SAVE HARDWARE AREA FOR DYNAMIC HUFFMAN TABLE GENERATION

DOMESTIC PRIORITY

This application is a continuation of U.S. application Ser. No. 16/275,608 entitled "REDUCING LATCH COUNT TO SAVE HARDWARE AREA FOR DYNAMIC HUFFMAN TABLE GENERATION," filed Feb. 14, 2019, incorporated herein by reference in its entirety.

BACKGROUND

The present invention relates to digital computer systems, and more particularly, to digital data compression and decompression schemes employed in digital computer systems.

Digital computer systems perform data compression to realize a more efficient use of finite storage space. The computer system typically includes a hardware component referred to as a compression accelerator, which accepts work requests or data requests from the host system to compress or decompress one or more blocks of the requested data. When designing an accelerator to perform compression, there is a tradeoff between the size of the input data that is to be compressed compared to the possible compression ratio and the latency that results from compressing the data.

Compression accelerators often utilize a "DEFLATE" algorithm, which is a lossless compression scheme that combines the Lempel-Ziv (e.g., LZ77) compression algorithm with a Huffman encoding algorithm to perform the compression. The computed output from the Huffman algorithm can be viewed as a variable-length code table for encoding a source symbol (such as a character in a file). The Huffman algorithm derives this table from the estimated probability or frequency of occurrence (weight) for each possible value of the source symbol.

To maximize the compression ratio achieved using the DEFLATE algorithm, symbols are encoded into the variable-length code table according to their frequency of occurrence. In other words, the most frequent symbols are encoded with the fewest bits, while relatively less common symbols are encoded with relatively more bits. This results in a direct reduction in the required storage space for the compressed data stream. Because the symbols are encoded based on their relatively frequencies, the occurrence counts for each symbol must be sorted. Sorting the symbol counts (frequencies) during this process is expensive in terms of area (the number of latches and width comparators required), power, and timing/wiring considerations.

SUMMARY

Embodiments of the present invention are directed to an accelerator, such as a DEFLATE compression accelerator, that is configured to reduce the required latch count during dynamic Huffman table generation. A non-limiting example of the accelerator includes an input buffer and a Lempel-Ziv 77 (LZ77) compressor communicatively coupled to an output of the input buffer. The accelerator further includes a Huffman encoder communicatively coupled to the LZ77 compressor. The Huffman encoder includes a bit translator. The accelerator further includes an output buffer communicatively coupled to the Huffman encoder.

In some embodiments of the invention, the bit translator is a 24-bit to 10-bit translator.

In some embodiments of the invention, the bit translator is configured to generate a 5-bit shift field and a 5-bit mantissa based on a first symbol count.

In some embodiments of the invention, the bit translator is further configured to concatenate the 5-bit shift field and the 5-bit mantissa to generate the second symbol count.

Embodiments of the present invention are directed to a method for reducing a latch count required for symbol sorting when generating a dynamic Huffman table. A non-limiting example of the method includes determining a plurality of first symbol counts. Each of the first symbol counts includes a first bit width. The method further includes generating a plurality of second symbol counts. The second symbol counts are based on a reduced-bit mapping of the first symbol counts. The plurality of second symbol counts are sorted by frequency and used to generate a dynamic Huffman tree.

In some embodiments of the invention, a 5-bit shift field and a 5-bit mantissa is generated based on a first symbol of the plurality of first symbol counts.

In some embodiments of the invention, the 5-bit shift field encodes a position of the most significant non-zero bit of the first symbol.

In some embodiments of the invention, the 5-bit mantissa encodes the most significant non-zero bit and the next four bits of the first symbol.

In some embodiments of the invention, the 5-bit mantissa encodes the next five bits of the first symbol following the most significant non-zero bit.

Embodiments of the present invention are directed to a computer program product for reducing a latch count required for symbol sorting when generating a dynamic Huffman table. A non-limiting example of the computer program product includes program instructions executable by an electronic computer processor to control the computer system to perform operations. The operations can include determining a plurality of first symbol counts. Each of the first symbol counts includes a first bit width. The operations can further include generating a plurality of second symbol counts. The second symbol counts are based on a reduced-bit mapping of the first symbol counts. The plurality of second symbol counts are sorted by frequency and used to generate a dynamic Huffman tree.

Embodiments of the present invention are directed to a system for reducing a latch count required for symbol sorting when generating a dynamic Huffman table. A non-limiting example of the system includes an accelerator, a memory having computer readable instructions, and a processor configured to execute the computer readable instructions. The computer readable instructions, when executed by the processor, cause the accelerator to perform a method. The method can include determining a plurality of first symbol counts, each of the first symbol counts comprising a first bit width. A plurality of second symbol counts can be generated. Each of the second symbol counts can be based on a mapping of a symbol count of the plurality of first symbol counts. The second symbol counts can include a second bit width less than the first bit width. The method can further include sorting the plurality of second symbol counts by frequency and generating a dynamic Huffman tree based on the sorted plurality of second symbol counts.

Embodiments of the present invention are directed to a method. A non-limiting example of the method includes receiving, from an input buffer, a data stream comprising a first symbol. A first symbol count having a first bit width can be determined based on the first symbol. The method can include generating a 5-bit shift field and a 5-bit mantissa based on the first symbol count. A second symbol count having a second bit width can be generated by concatenating the 5-bit shift field and the 5-bit mantissa. The method can include sorting a frequency of the second symbol count.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1B:
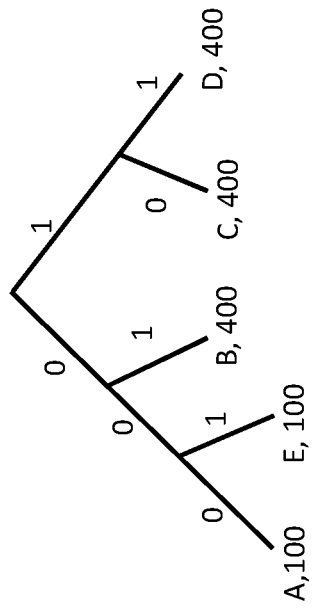
FIGS. 1A and 1B depict Huffman trees generated in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, the reduction in data-representation size produced by an applied data compression algorithm is typically referred to as the compression ratio (C/R). The compression ratio can be defined as the ratio between the uncompressed size and compressed size. Thus, as the compression ratio increases, a more efficient use of the computer system's storage space is achieved, thereby improving the overall performance of the computer system.

The DEFLATE data compression algorithm is a commonly used method for compressing data. When compressing data, there are two main parts to the DEFLATE algorithm: (1) LZ77 compression to identify duplicate strings and (2) a Huffman encoding of this information.

The LZ77 compression phase attempts to find duplicate strings in a previously encoded source operand. When a match is found, instead of outputting the literal characters of the duplicate string, the LZ77 compression phase instead outputs the "distance" from the duplicate string to the original (matching) string in the prior data set history, along with the matching "length" of the data. For example, suppose the input operand contains the following symbols: ABBACBABBAABBABBA. This operand could be encoded as follows:

literal byte A; literal byte B; literal byte B; literal byte A; literal byte C;

literal byte B; distance 6, length 4 (this encodes "ABBA"); distance 4, length 8 (this encodes "ABBAABBA")

As can be seen, the more duplicate strings that can be found in the input operand data, the more the output can be compressed. There are two ways the input operand history can be checked for matching strings: an inline history, and via a circular history buffer. For inline histories, the LZ77 compressor simply looks at prior input from the source operand. For a circular history buffer, input data is copied (either actually copied or conceptually copied) to a circular history buffer, and then data in this buffer is searched for matches. In either case, the DEFLATE standard allows looking back up to 32 KB for matching strings.

The Huffman encoding phase is based on the probability and distribution of the symbols generated by the LZ77 compressor. The idea behind Huffman encoding is that symbols can be encoded with variable bit lengths such that frequent symbols are encoded with few bits and rare symbols with many bits. In this manner a further compression of the data obtained from the LZ77 compressor is possible.

For this encoding process, the DEFLATE standard supports three types of compressed data blocks: literal copy blocks, a Fixed Huffman Table (FHT), and a Dynamic Huffman Table (DHT). An FHT block is static, while a DHT block consists of a highly compressed version of a Huffman tree, followed by the symbols, encoded using that tree, representing the compressed data.

Figure 1A:
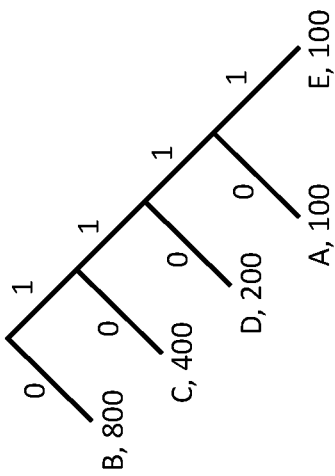

Example Huffman trees are illustrated in FIGS. 1A and 1B. As depicted in FIG. 1A, a Huffman tree can be highly asymmetrical, with the majority of the nodes (also referred to as leaves) occurring along a single branch of the tree. Alternatively, a Huffman tree can be compressed as shown with respect to FIG. 1B, with leaves distributed throughout the available branches. In either case, a Huffman tree is constructed such that the depth of the leaves (nodes) are determined by the frequency of the symbols corresponding to each leaf. In other words, the depth of a leaf is determined by its symbol frequency.

Table 1 illustrates an exemplary DHT corresponding to the Huffman tree depicted in FIG. 1A. The DHT shown in Table 1 is constructed such that symbols having relatively higher counts/frequencies are encoded using relatively shorter code lengths.

TABLE 1

Dynamic Huffman Table

| Symbol | Frequency | Binary Code |
|---|---|---|
| A | 100 | 1110 (4 bits) |
| B | 800 | 0 (1 bit) |
| C | 400 | 10 (2 bits) |
| D | 200 | 110 (3 bits) |
| E | 100 | 1111 (4 bits) |

As shown in Table 1, the "A" and "E" symbols have the lowest frequency, occurring only 100 times each. The "D" symbol has the next highest frequency and occurs 200 times in the dataset. The "C" symbol occurs 400 times in the dataset, and the "B" symbol occurs most frequently, with 800 occurrences. As further shown in Table 1, the "A" symbol is encoded as the binary number "1110," the "B" symbol as "0," the "C" symbol as "10," the "D" symbol as "110," and the "E" symbol as "1111."

Encoding the most frequent symbols (e.g., "B" in the above example) with the fewest bits results in a direct reduction in the required storage space for the compressed data stream. For example, the "B" symbol, which occurs 800 times, can be represented as a single "0" bit for each occurrence. Consequently, only 800 bits (100 bytes) are required to store every occurrence of the "B" symbol. "E," a less frequent symbol, can be represented as a longer binary code such as "1111." As a result, the 100 occurrences of the "E" symbol require 400 bits (50 bytes) of storage. Continuing with this example, the symbols depicted in Table 1 can be encoded using 375 total bytes. This same data, without the use of a DHT, requires 1600 bytes of storage.

To increase the speed of DEFLATE compression, this Huffman tree generation process can be implemented in hardware. The LZ77 algorithm in DEFLATE uses 256 literals (ASCII values 0x00-xFF), 29 length symbols, and 30 distance symbols for compression. The length and distance symbols represent the distances and lengths of matching strings in a data stream (data history). Since length is always followed by distance, one DHT can be built to encode the literals, an End-of-Block symbol, and the length symbols. This requires a total 286 alphabets of symbols. A second DHT can be built for the distance symbols. This requires a total 30 alphabets of symbols.

One challenge associated with the Huffman tree generation process is the difficulty in actually populating each DHT leaf with the correct symbol. For each leaf, the symbol having the next highest frequency is needed. In other words, the frequency of each symbol must be determined, stored, and sorted. This sorting process can be expensive in terms of area (the number of latches and width comparators required), power, and timing/wiring considerations.

To illustrate this point, consider an LZ77 compression on $2^n$ bytes of data. To fully (uniquely) encode all 286 alphabet symbols into the first DHT of a Huffman encoder (i.e., the DHT encoding the literals, End-of-Block, and the length symbols) would require N-bit counters. For example, LZ77 compression on 16 MB of data, using all 286 symbols, would require 24-bit counters. In another example, LZ77 compression on 32 MB of data, using all 286 symbols, would require 25-bit counters.

To store the counts associated with each of these 286 symbols, a sort block can be used to store 286 "symbol, count" pairs. In a hardware implementation, these pairs are stored in latches. Continuing from the previous example, to store 286 symbols having 24-bit counters requires 6,864 latches (sometimes referred to as flipflops). While this latch requirement is already area-intensive, the number of latches required increases by N for each additional bit required by the counters. For example, storing 286 symbols using 25-bit counters (for a 32 MB data stream) requires 7,150 latches. Similarly, storing 286 symbols using 26-bit counters (for a 64 MB data stream) requires 7,436 latches.

Turning now to an overview of the aspects of the inventive teachings, one or more embodiments address the above-described shortcomings of the prior art by providing new accelerator hardware and software implementations for reducing the latch count required for symbol sorting when generating dynamic Huffman tables. The latch count is reduced by mapping the X-bit symbol frequencies received from the LZ77 compressor (sometimes referred to as the "LZ count") to a Y-bit float-like representation that requires less than X bits (i.e., X is greater than Y) prior to sorting. The following process is explicitly demonstrated with respect to a 24-bit counter, however, it is understood that a low count mapping can be adapted to work for any N-bit counter. The 24-bit counter is merely selected for ease of discussion.

In some embodiments of the invention, a 24-bit counter (for 16 MB of data) can be mapped to a 10-bit value. To accomplish this, the 24-bit value is mapped to a 5-bit exponent (also referred to as a shift field) and a 5-bit mantissa (also referred to as the most significant digits).

The 5-bit exponent represents the position of first "1" in the 24-bit counter (this bit is referred to as the shift bit). Mathematically, the 5-bit exponent is the amount of shift needed to get the original value. For example, the first (most significant) "1" in the 24-bit value "000000010110111100010101" occurs at the 17$^{th}$ digit (read from the right). The 17$^{th}$ digit can be encoded as the 5-bit binary number "10001."

Once this shift is known, the "0" bits to the left of the shift bit can be discarded without losing any information. Note that a 5-bit exponent is needed to store every possible location of the shift bit in a 24-bit counter (5 binary digits are needed to uniquely encode the 24 shift possibilities). While shown as a 5-bit exponent, the number of bits can be more, or less, depending on the underlying counter that is being mapped. For example, a 32-bit counter requires a 6-bit exponent for an exhaustive mapping of the shift bit.

The 5-bit mantissa contains the five most significant bits of non-zero data present in 24-bit counter. In some embodiments of the invention, the 5-bit mantissa includes the shift bit, while in other embodiments the shift bit is skipped. For example, the 5-bit mantissa generated from the previous example, "000000010110111100010101," is "10110" (when including the shift bit and the next four digits) and "01101" (when skipping the shift bit and including the next five digits).

In either case, these 5-bit values are then combined to provide a 10-bit many-to-one mapping of the 24-bit counter. A "many-to-one" mapping refers to any mapping where two or more input values will map to the same output value. Continuing with the previous example, multiple 24-bit counters will map to the same 10-bit value.

While both approaches are possible and within the contemplated scope of the invention, the second approach leverages one extra bit of data (the shift bit is not reused). Consequently, the second approach can reduce the number of many-to-one mappings which would be generated using the first approach. Continuing from the previous 24-bit example, the first approach (shift bit is the first digit of mantissa) results in a 32-1 mapping, while the second approach (ignore the shift bit) results in a 16-1 mapping. To illustrate, for LZ counts having a value of "1_ _ _ _ XXXXX" (where "_" denotes bit values that are the same in all the LZ counts and "X" indicates different bit values), all 32 of these numbers would be mapped to 1 number (i.e., a 32:1 mapping). Alternatively, for LZ counts having a value of "1_ _ _ _ _XXXX," only 16 of these numbers would be mapped to 1 number (i.e., a 16:1 mapping).

To illustrate this point further, consider the 10-bit mappings of the 24-bit representations of the numbers 929 and 959, "1110100000" and "1110111111," respectively (leading zeros have been discarded). Reusing the shift bit (here, the 10$^{th}$ digit from the right, having a binary value of "01010") results in same 10-bit numbers: "01010,11101" and "01010,11101." Ignoring the shift bit in the mantissa, however, results in the unique 10-bit numbers "01010, 11010" and "01010,11011."

Constructing the many-to-one mapping in this manner (shift, mantissa) results in a loss of the exact count (or frequency) for each symbol but preserves the relative frequency distribution of the symbols. For example, consider symbols "A," "B," "C," and "D" having frequency counts in a 16 MB data stream of 11, 104, 418, 1117, respectively. 24-bit counters can fully encode the exact "symbol, count" pair for all 286 symbols in the sort block. The 10-bit mapping (5-bit shift, 5-bit mantissa) will lose the exact count values for these symbols, but will preserve the relative frequencies (i.e., D count>=C count>=B count>=A count).

Because the relative symbol frequencies are preserved, the latch count can be reduced without impacting the DHT tree quality. In other words, the present disclosure allows for Huffman trees to be populated without knowing the exact frequencies of the symbols. Moreover, because the deflate algorithm does not allow DHT trees to be more than 15 levels deep (i.e. the encode length should be 15 bits or less), allowing many-to-one mappings for high-frequency symbols does not introduce errors into the DHT tree.

Reducing the number of latches for a given sort block frees valuable wafer area, reduces power consumption, and simplifies the timing/wiring of the accelerator hardware. Continuing with the previous example, mapping a 24-bit counter to a 10-bit value prior to the sorting block reduces the number of required latches from 6,864 latches (24*286) to 2,860 latches (10*286). Moreover, the use of 10-bit values simplifies the later sorting step, as 10-bit comparators can replace the conventional 24-bit comparators. This results in further area savings.

In some embodiments of the invention, the widths of the exponent (shift) and mantissa are fixed (e.g., 5-bits each, as previously discussed). In some embodiments of the invention, the widths of the exponent (shift) and mantissa can be dynamically adjusted. The widths can be adjusted, for example, depending on the LZ-count range.

To illustrate, consider "K" bits implemented to represent the LZ count in "shift, mantissa" format (i.e., "K" was 10 in the previous examples using a 5-bit exponent and a 5-bit mantissa). Depending on upper bound of LZ count, "i" bits can be assigned to the shift bit and "K–i" bits can be assigned to the mantissa. This results in a finite improvement in sorting accuracy for the same, fixed hardware cost.

Table 2 illustrates exemplary dynamic widths based on various LZ-count ranges. As shown in Table 2, the many-to-one mapping can be decreased as the LZ count range increases by dynamically allocating extra bits to the mantissa. While Table 1 illustrates shifting a single bit from the shift field to the mantissa, other dynamic adjustments are possible.

TABLE 2

Dynamic Shift and Mantissa Widths

| LZ Count Range | 5-bit Shift + 5-bit Mantissa | 4-bit Shift + 6-bit Mantissa |
|---|---|---|
| 0-63 | 1:1 | 1:1 |
| 64-127 | 2:1 | 1:1 |
| 128-255 | 4:1 | 2:1 |
| $2^N:2^{N+1} - 1$ | 2N-5:1 | $2^{N-6}$:1 |

In some embodiments of the invention, the width of the shift field is made as small as possible, based on the LZ Count Range, to free extra bits for the mantissa. The width of the shift field can be decreased until the point where the loss of a bit will result in some shift bit locations no longer being uniquely assignable.

Figure 2:
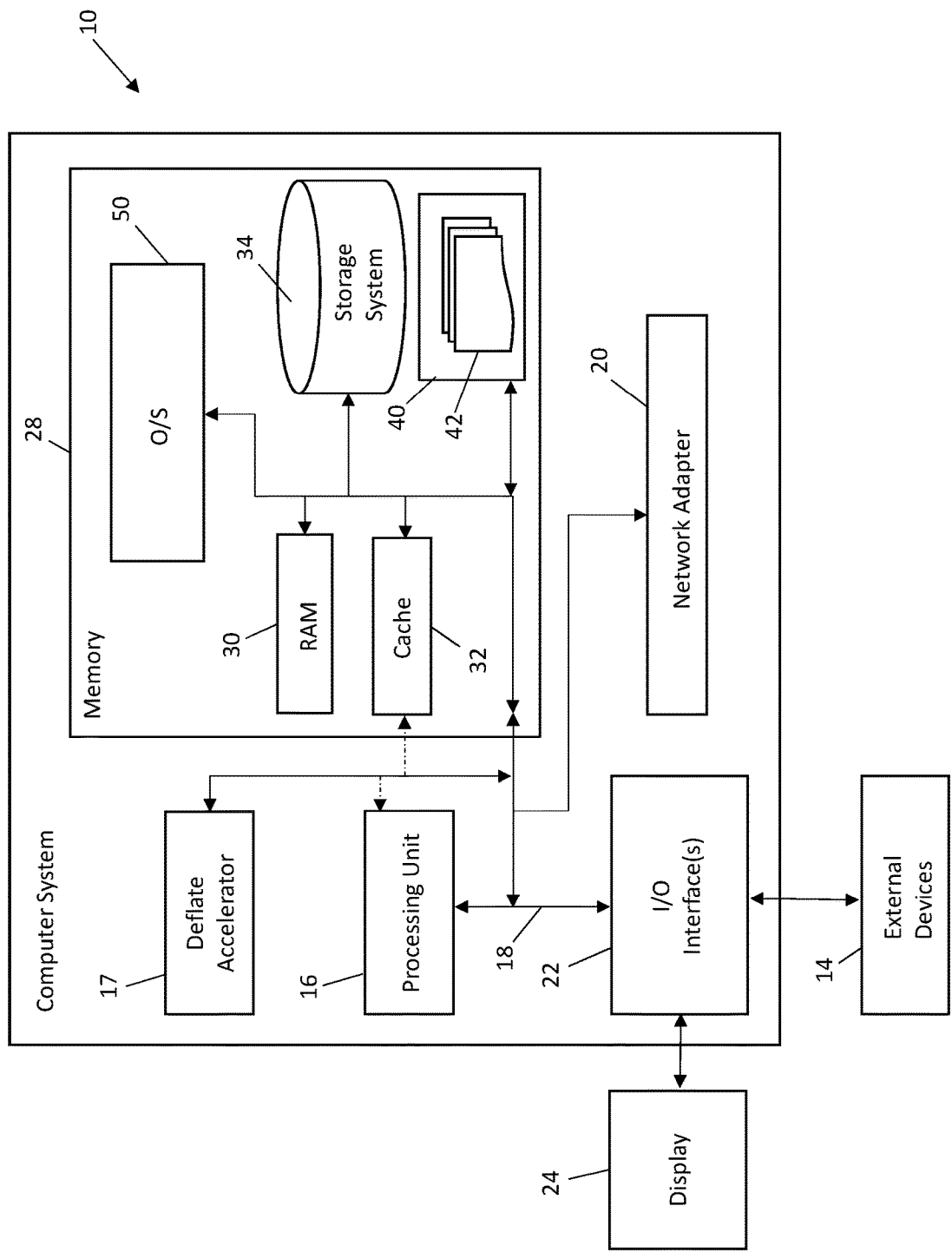
FIG. 2 illustrates a block diagram of a computer system which is capable of compressing and decompressing data in accordance with various embodiments of the invention.

With reference now to FIG. 2, a computer system 10 is illustrated in accordance with a non-limiting embodiment of the present disclosure. The computer system 10 can be based on the z/Architecture, for example, offered by International Business Machines Corporation (IBM). This architecture, however, is but one example of the computer system 10 and is not intended to suggest any limitation as to the scope of use or functionality of embodiments described herein. Other system configurations are possible. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 2, computer system 10 is depicted in the form of a general-purpose computing device, also referred to as a processing device. The components of computer system 10 may include, but are not limited to, one or more processors or processing unit(s) 16, a deflate accelerator 17, a system memory 28, and a bus 18 that couples various system components including system memory 28 to processing unit 16.

Figure 3:
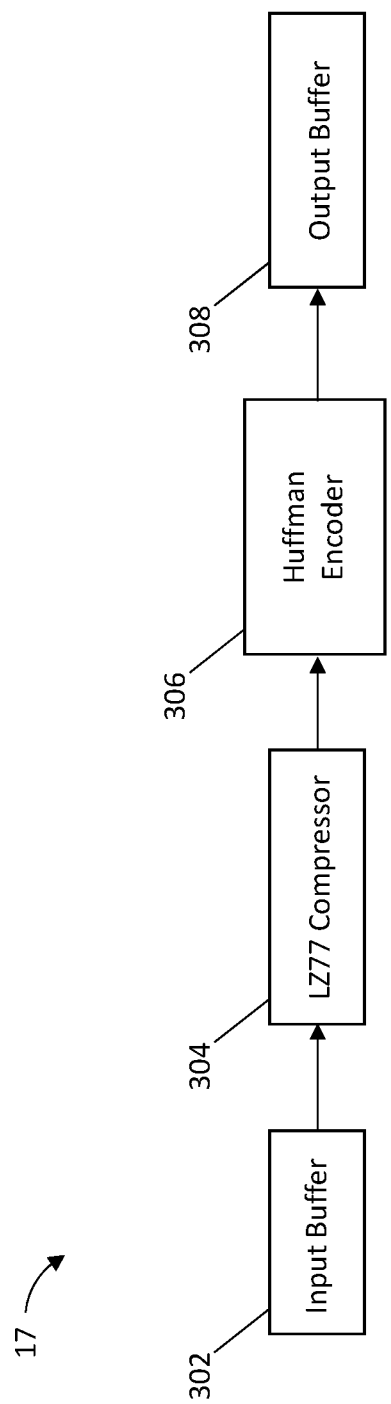
FIG. 3 illustrates a block diagram of an accelerator according to one or more embodiments.

The deflate accelerator 17 can be implemented as hardware or as both hardware and software and can include functionality and modules for compressing data using the DEFLATE data compression algorithm according to one or more embodiments. In some embodiments of the invention, the deflate accelerator 17 can receive data on an input buffer, process the data using an LZ77 compressor, encode the data using a Huffman encoder, and output the data to an output buffer. An embodiment of the deflate accelerator 17 is depicted in FIG. 3.

In some embodiments of the invention, the deflate accelerator 17 can be connected directly to the bus 18 (as depicted). In some embodiments of the invention, the deflate accelerator 17 is connected to the bus 18 between the RAM 30/cache 32 and the processing unit 16. In some embodiments of the invention, the deflate accelerator 17 is directly connected to the cache 32 (e.g., to the L3 cache), rather than to the bus 18. In some embodiments of the invention, the deflate accelerator 17 is directly connected to the processing unit 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library that includes APIs for performing the data manipulation functions provided by the specialized hardware devices such as, for example, an accelerator (not shown in FIG. 1).

The storage system 34 can store a basic input output system (BIOS). The BIOS is a set of essential routines that initialize and test hardware at startup, start execution of the OS 50, and support the transfer of data among the hardware devices. When the computer system 10 is in operation, one or more of the processing units 16 are configured to execute instructions stored within the storage system 34, to communicate data to and from the memory 28, and to generally control operations of the computer system 10 pursuant to the instructions.

One or more of the processing unit 16 can also access internal millicode (not depicted) and data stored therein. The internal millicode (sometimes referred to as firmware) can be viewed as a data storage area that is separate and different from the main memory 28 and can be accessed or controlled independent from the OS. The internal millicode can contain part of the complex architected instructions of the computer system 10. A complex instruction can be defined as a single instruction to the programmer; however, it may also include internally licensed code which breaks one complex instruction into many less complex instructions. The millicode contains algorithms that have been designed and tested specifically for computer system 10 and can provide full control over the hardware. In at least one embodiment, the millicode can also be utilized to store one or more compression dictionaries, which can be delivered to the hardware to facilitate data decompression as described in greater detail below.

Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv 77 (LZ77) algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". To Huffman encode and decode data, a system must know in advance that the Huffman tree is being used. To accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must, therefore, be written to the output.

Huffman encoding may also use a variable-length code table based on entropy to encode source symbols, and as previously mentioned, is defined either as either static or dynamic. In static Huffman coding, each literal or distance is encoded using a fixed table (FHT) that is defined in the RFC. In dynamic Huffman coding, however, special coding tables (DHTs) are constructed to better suit the statistics of the data being compressed. In most cases, using a DHT achieves better compression ratio (e.g., quality) when compared to FHT, at the expense of degrading the compression rate (e.g., performance) and adding design complexity. The fixed and dynamic Huffman encoding methods best reflect the built-in tradeoff between compression rate and ratio. The static Huffman method may achieve a lower compression ratio than is possible using dynamic Huffman coding. This is due to using a fixed encoding table regardless of the content of the input data block. For example, random data and a four-letter DNA sequence would be encoded using the same Huffman table.

In some embodiments of the invention, the computer system 10 includes a compression library that can be implemented as a software library used for deflation/inflation and can be an abstraction of a compression algorithm. In at least one embodiment, the compression library allows the computer system 10 and/or the deflate accelerator 17 to break up input data to be deflated/inflated in arbitrary ways across multiple requests and provides arbitrary sized output buffers to hold the results of the deflate/inflate operation.

FIG. 3 depicts a block diagram of the deflate accelerator 17 shown in FIG. 2 according to one or more embodiments. The deflate accelerator 17 can include, for example, an input buffer 302, an LZ77 compressor 304, a Huffman encoder 306 (sometimes referred to as a DEFLATE Huffman encoder), and an output buffer 308. As shown in FIG. 3, the input buffer 302 can be communicatively coupled to the LZ77 compressor 304 and the output from the LZ77 compressor 304 can be directly connected to the input of the Huffman encoder 306. In this manner, the DEFLATE accelerator 200 is configured to facilitate data compression using the DEFLATE algorithm.

In some embodiments of the invention, uncompressed data is obtained by the deflate accelerator 17 on the input buffer 302 (sometimes referred to as an input data buffer). In some embodiments of the invention, the deflate accelerator 17 performs an LZ77 compression on the data provided to the input buffer 302. In some embodiments of the invention, the compressed data is received by, and encoded by, the Huffman encoder 306. In some embodiments of the invention, the compressed and encoded data can be stored in the output buffer 308 (sometimes referred to as an output data buffer).

To initiate data compression, the deflate accelerator 17 can receive one or more requests to compress targeted data or a targeted data stream in the input buffer 302. In some embodiments of the invention, a request block (not depicted) can be used to facilitate the request. In some embodiments of the invention, the request block is delivered to a compression interface of the OS 50. For each request, the computer system 10 can supply an input buffer (e.g., the input buffer 302) with the data to be processed and an output buffer (e.g., the output buffer 308) where the processed data results are stored.

In some embodiments of the invention, to begin processing a compression request, the deflate accelerator 17 reads a request block, and processes the data in the input buffer 302 to generate compressed or and/or decompressed data. As described herein, various compression algorithms can be employed including, but not limited to, the DEFLATE compression algorithm and ALDC algorithms. The resulting compressed data can be saved in the output buffer 308.

Figure 4:
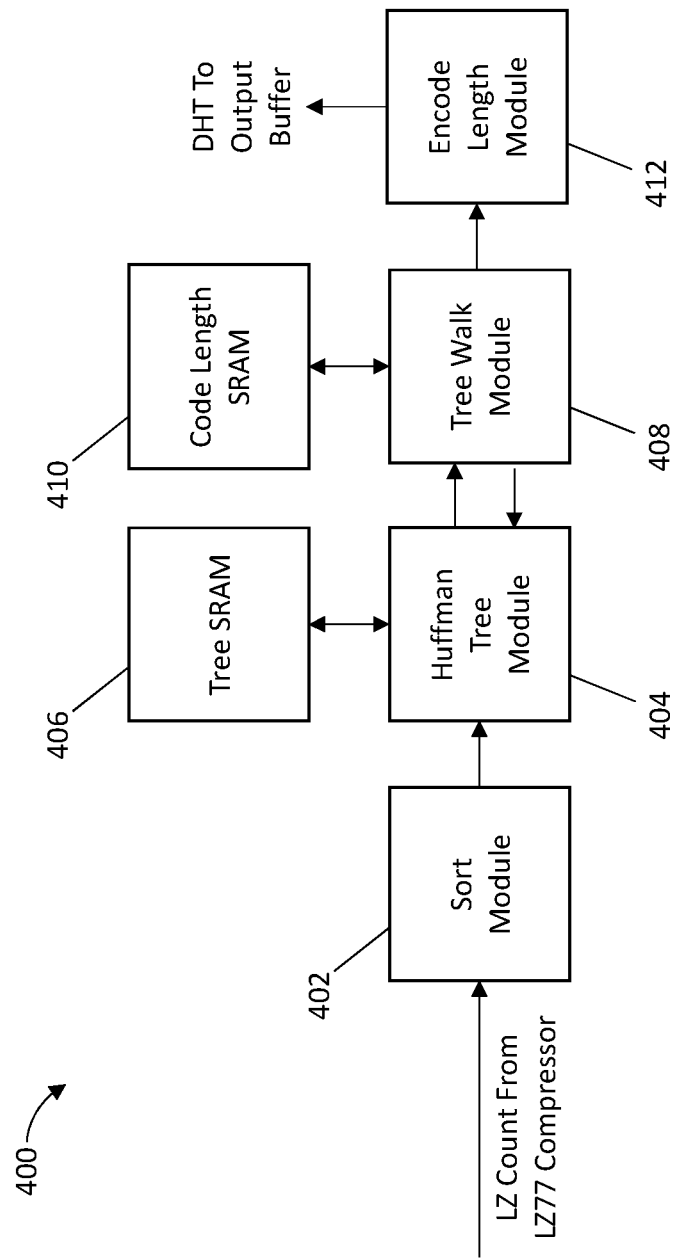
FIG. 4 illustrates portions of a Huffman encoder of the accelerator depicted in FIG. 3.

FIG. 4 depicts a block diagram of a DHT generator 400 of the Huffman encoder 306 shown in FIG. 3 according to one or more embodiments. As illustrated in FIG. 4, the DHT generator 400 can include a sort module 402, a Huffman tree module 404, tree static random access memory (SRAM) 406, a tree walk module 408, code length SRAM 410, and a encode length module 412. In some embodiments of the invention, the DHT generator 400 is a first stage of a Huffman encoder (e.g., the Huffman encoder 306 shown in FIG. 3).

The sort module 402 receives a symbol frequency counter ("LZ Count," an X-bit counter) for each symbol compressed by the LZ77 compressor 304. The sort module 402 then maps the X-bit counter to a compressed many-to-one Y-bit value according to one or more embodiments. In some embodiments of the invention, the Y-bit values are sorted (generating a relative frequency distribution of the symbols, as discussed previously herein).

In some embodiments of the invention, the Y-bit mappings can be decompressed back into X-bit values after sorting, but prior to the Huffman tree module 404. In this manner, the Huffman tree module 404 can receive full X-bit values and does not need to be modified. Similarly, any remaining downstream modules, including the Huffman tree module 404, tree SRAM 406, the tree walk module 408, code length SRAM 410, and the encode length module 412 do not need to be modified. In other words, the Huffman tree module 404, tree SRAM 406, tree walk module 408, code length SRAM 410, and encode length module 412 can be implemented using known DEFLATE compression implementations and are not meant to be limited. While depicted as having separate modules for ease of discussion, it is understood that the DHT generator 400 can include more, or fewer modules. For example, the output of the sort module 402 can be received and encoded into a DHT by a single Huffman tree module and may or may not include separate tree SRAM and/or code length SRAM.

Figure 5:
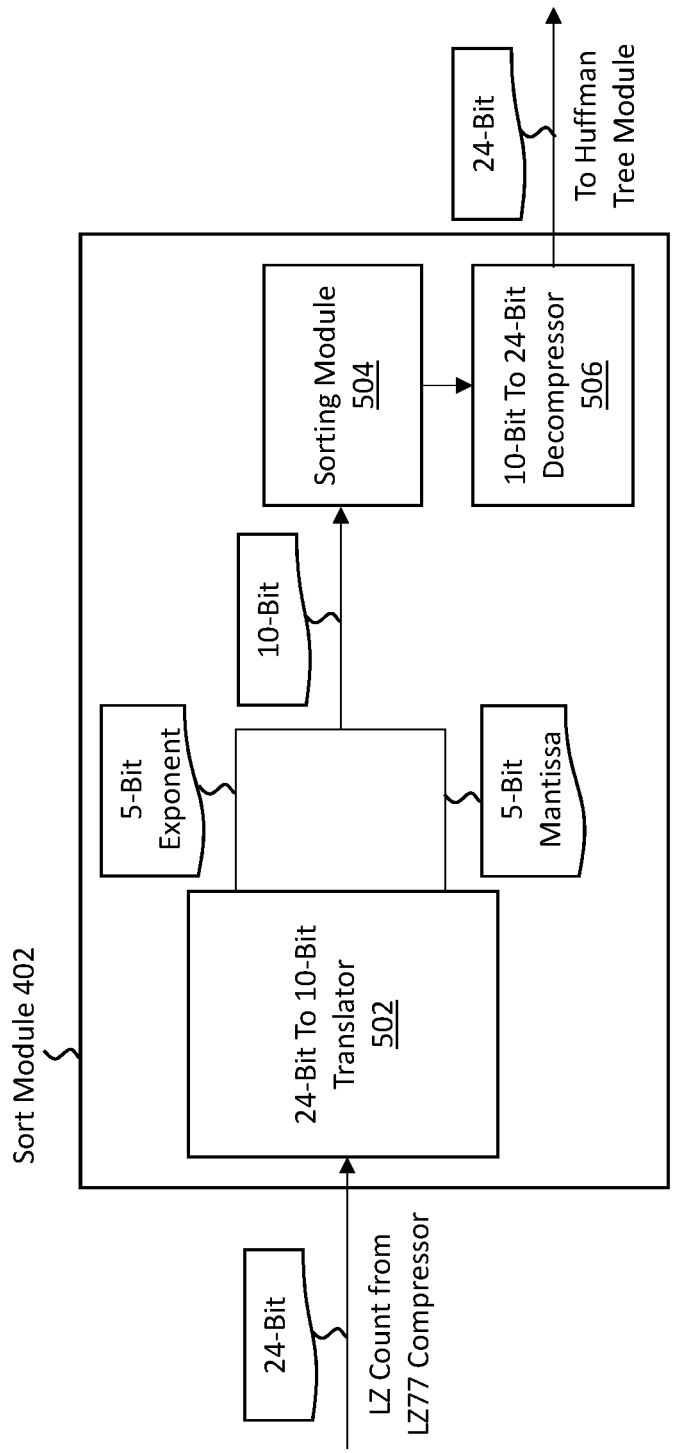
FIG. 5 illustrates portions of a sort module of a DHT generator of the Huffman encoder depicted in FIG. 4.

FIG. 5 depicts a block diagram of the sort module 402 shown in FIG. 4 according to one or more embodiments. As depicted in FIG. 5, the sort module 402 (also referred to as a sort block) can include a bit translator. The 24-Bit to 10-Bit Translator 502 is depicted for ease of discussion; other X-Bit to Y-Bit translations are possible, as previously discussed herein.

In some embodiments of the invention, the 24-Bit to 10-Bit Translator 502 receives a 24-bit counter from an LZ77 compressor (e.g., the LZ77 compressor 304 depicted in FIG. 3). In some embodiments of the invention, the 24-Bit to 10-Bit Translator 502 generates a 5-bit exponent and a 5-bit mantissa based on the 24-bit counter according to the following algorithm:

Step 1: Determine the leading zero-bit (LZB) index for the 24-bit counter, where indices are 1 to 24 from least to most significant bits (1 to 25 for a 25-bit counter, etc.).

Step 2: Generate a 29-bit vector by concatenating the 24-bit counter with "00000." For example, the 24-bit value "000000010110111100010101" can be concatenated with "00000" to form "000000010110111100010101.00000."

Step 3: Shift the 29-bit vector by the LZB index.

Step 4: Store the shift amount (i.e., the shift bit location) as a 5-bit exponent. For example, the 17$^{th}$ digit of the 24-bit value "000000010110111100010101" (read from the right, underlined for emphasis) can be stored as the 5-bit binary number "10001."

Step 5: Store the five most significant digits as a 5-bit mantissa. In some embodiments of the invention, the five most significant digits include the shift bit and the next four digits. For example, the 5-bit mantissa generated from the 24-bit value "000000010110111100010101" can be "10110." In some embodiments of the invention, the five most significant digits includes the five digits immediately following the shift bit. For example, the 5-bit mantissa generated from the 24-bit value "0000000 10110111100010101" can be "01101."

Step 6: Concatenate the 5-bit exponent and the 5-bit mantissa to generate a 10-bit value. Continuing from the previous example where the shift bit is ignored in the mantissa, the 10-bit value is "10001,01101" (shift, mantissa).

In some embodiments of the invention, the 24-Bit to 10-Bit Translator 502 receives a 24-bit counter from the LZ77 compressor for each symbol in a data stream (e.g., 286 24-bit counters for each of 286 symbols in a DHT). In some embodiments of the invention, a 10-bit value is generated for each of the 24-bit counters. These 10-bit values can be passed to a sorting module 504.

In some embodiments of the invention, the sorting module 504 completes a value sort of the 286 10-bit values. The sorting of the 10-bit values can be accomplished using any suitable method known for DEFLATE accelerators. In some embodiments of the invention, the sorting module 504 stores 286 "symbol, count" pairs in 2,860 latches and uses a 2-D shear sort for fast execution. For a 2-D shear sort, the 286 "symbol, count" pairs can be arranged in a 18×16 matrix populated with 143 comparators. The comparators are spaced such that no two comparators are horizontally or vertically adjacent (immediately left, right, up, or down). Instead, each of the comparators is diagonally adjacent to one or more other comparators. Advantageously, 10-bit comparators can be used instead of 24-bit comparators, further increasing the area savings afforded by the 10-bit mappings. In some embodiments of the invention, the sorted 10-bit values can then be used to generate a dynamic Huffman tree.

In some embodiments of the invention, downstream processes (after sorting) require conversion back to 24-bit values. This allows, for example, an easy addition of LZ counts from 2 ascending symbols and a comparison of the LZ count of the next symbol. In some embodiments of the invention, a 10-Bit to 24-Bit decompressor 506 receives each 10-bit number from the sorting module 504 and converts each back to a 24-bit number. A 10-Bit to 24-Bit decompressor is depicted for ease of discussion; other Y-Bit to X-Bit decompressors are possible, as previously discussed herein.

A 24-bit number can be constructed from the 10-bit number according to the following algorithm: Step 1. Generate a 29-bit field with all digits set to "0." Step 2. Copy the mantissa from the 10-bit number into the least significant digits of the 24-bit number. Step 3. Shift by the value of the shift bit (or shift bit less one, if the shift bit is ignored in the mantissa) and insert the shift bit if not included in the mantissa. Step 4. Discard five of the leading bits (always "0" by construction) to convert the 29-bit field to a 24-bit field.

To illustrate, consider the 10-bit number "01010,11010" generated, for example, from the compression of the number 928 as discussed previously herein (mantissa ignoring the shift bit). At step 2, the 29-bit field is set to "00 . . . 0011010" (leading zeros truncated). At step 3, the 29-bit field is shifted 10 digits (10 is the decimal value of the shift bit "01010") and the shift bit is inserted, resulting in "00 . . . 001110100000.00000." At step 4, five of the leading "0s" (the leftmost digits) are dropped, resulting in the 24-bit number "000000000111010000000000." While the previous example is provided in the context of a 10-Bit to 24-Bit decompressor, the same scheme can be used to decompress an LZ Count having any initial bit width (e.g., 11 bits, 12, bits, 20 bits, etc.).

Figure 6:
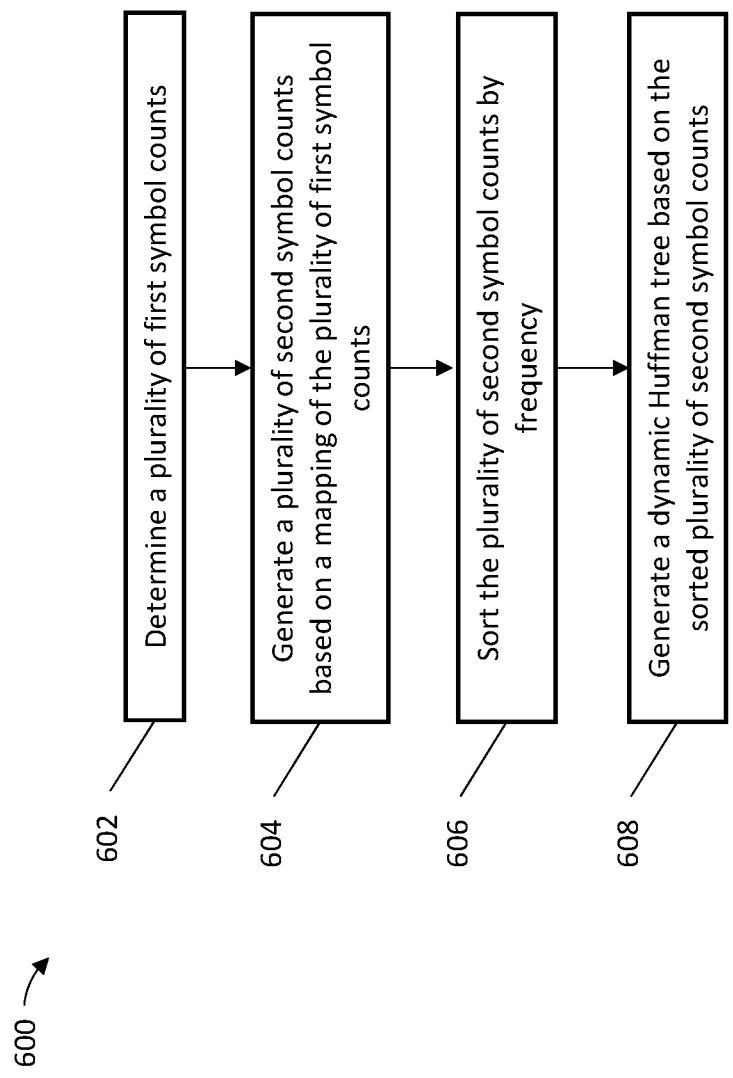
FIG. 6 is a flow diagram illustrating a method according to a non-limiting embodiment.

FIG. 6 depicts a flow diagram 600 illustrating a method for reducing a latch count required for symbol sorting when generating a dynamic Huffman table according to a non-limiting embodiment. As shown at block 602, a plurality of first symbol counts is determined. Each of the first symbol counts can include a first bit width. In some embodiments of the invention, each of the first symbol counts is encoded as a 24-bit number.

At block 604, a plurality of second symbol counts is generated based on a mapping of the plurality of first symbol counts. The second symbol counts can include a second bit width less than the first bit width. In some embodiments of the invention, each of the second symbol counts is encoded as a 10-bit number.

In some embodiments of the invention, generating each of the second symbol counts includes generating a 5-bit shift field and a 5-bit mantissa according to one or more embodiments. In some embodiments of the invention, the 5-bit shift field encodes a position of the most significant non-zero bit of the first symbol (i.e., the shift bit, as discussed previously herein). In some embodiments of the invention, the 5-bit mantissa encodes the most significant non-zero bit and the next four bits of the first symbol (i.e., the shift bit is reused as the first digit in the mantissa). In some embodiments of the invention, the 5-bit mantissa encodes the next five bits of the first symbol following the most significant non-zero bit (i.e., the shift bit is not reused in the mantissa). In some embodiments of the invention, the 5-bit shift field and the 5-bit mantissa are concatenated to form a 10-bit number.

At block 606, the plurality of second symbol counts is sorted by frequency. At block 608, a dynamic Huffman tree is generated based on the sorted plurality of second symbol counts according to one or more embodiments. In some embodiments of the invention, the 10-bit mappings are decompressed back to 24-bit numbers prior to generating the dynamic Huffman tree, as discussed previously herein.

Figure 7:
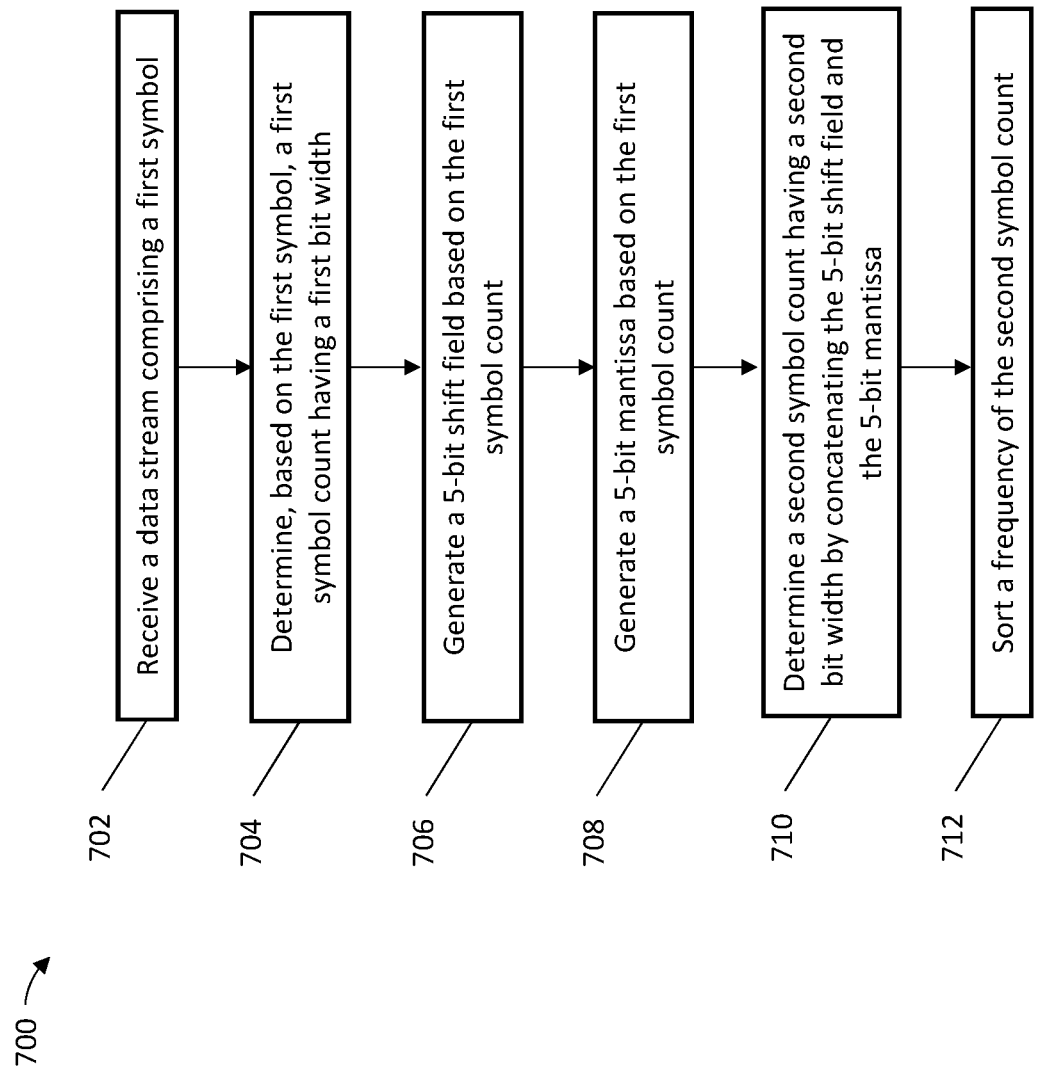
FIG. 7 is a flow diagram illustrating a method according to another non-limiting embodiment.

FIG. 7 depicts a flow diagram 700 illustrating a method according to a non-limiting embodiment. As shown at block 702, a data stream comprising a first symbol can be received from an input buffer.

At block 704, a first symbol count having a first bit width can be determined, based on the first symbol. In some embodiments of the invention, the first bit width is 24 bits.

At block 706, a 5-bit shift field is generated based on the first symbol count. In some embodiments of the invention, the 5-bit shift field encodes a position of the most significant non-zero bit of the first symbol.

At block 708, a 5-bit mantissa is generated based on the first symbol count. In some embodiments of the invention, the 5-bit mantissa encodes the next five bits of the first symbol following the most significant non-zero bit.

At block 710, a second symbol count having a second bit width is generated by concatenating the 5-bit shift field and the 5-bit mantissa. At block 712, a frequency of the second symbol count is sorted.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving a data stream comprising a first symbol;
   determining, based on the first symbol, a first symbol count having a first bit width, the first symbol count associated with an upper bound of a count range;
   determining a number of bits N based on the upper bound;
   generating an N-bit shift field based on the first symbol count;
   generating an M-bit mantissa based on the first symbol count, wherein M is equal to K−N, and wherein K comprises a total number of implemented bits;
   determining a second symbol count having a second bit width less than the first bit width by concatenating the N-bit shift field and the M-bit mantissa; and
   sorting a frequency of the second symbol count.

2. The method of claim 1, wherein the N-bit mantissa encodes the most significant non-zero bit and the next N−1 bits of the first symbol.

3. The method of claim 1, wherein the N-bit mantissa encodes the next N bits of the first symbol following the most significant non-zero bit.

4. The method of claim 1, wherein the data stream comprises an LZ77 compression output.

5. The method of claim 1, wherein determining the number of bits N comprises decreasing a number of many-to-one mappings by allocating extra bits to the M-bit mantissa.

6. The method of claim 5, wherein the number of bits N is decreased, based on the upper bound, until a loss of a bit will result in at least one shift bit location no longer being uniquely assignable.

7. The method of claim 1, wherein K is 10.

8. The method of claim 7, wherein N is 5 and M is 5.

9. The method of claim 7, wherein N is 4 and M is 6.

10. A computer program product for reducing a latch count required for symbol sorting when generating a dynamic Huffman table, the computer program product comprising a computer readable storage medium having program instructions embodied therewith, the program instructions executable by an electronic computer processor to control a computer system to perform operations comprising:
    receiving a data stream comprising a first symbol;
    determining, based on the first symbol, a first symbol count having a first bit width, the first symbol count associated with an upper bound of a count range;
    determining a number of bits N based on the upper bound;
    generating an N-bit shift field based on the first symbol count;
    generating an M-bit mantissa based on the first symbol count, wherein M is equal to K−N, and wherein K comprises a total number of implemented bits;
    determining a second symbol count having a second bit width less than the first bit width by concatenating the N-bit shift field and the M-bit mantissa; and
    sorting a frequency of the second symbol count.

11. The computer program product of claim 10, wherein the N-bit mantissa encodes the most significant non-zero bit and the next N−1 bits of the first symbol.

12. The computer program product of claim 10, wherein the N-bit mantissa encodes the next N bits of the first symbol following the most significant non-zero bit.

13. The computer program product of claim 10, wherein the data stream comprises an LZ77 compression output.

14. The computer program product of claim 10, wherein determining the number of bits N comprises decreasing a number of many-to-one mappings by allocating extra bits to the M-bit mantissa.

15. The computer program product of claim 14, wherein the number of bits N is decreased, based on the upper bound, until a loss of a bit will result in at least one shift bit location no longer being uniquely assignable.

16. A system for reducing a latch count required for symbol sorting when generating a dynamic Huffman table, the system comprising:
    an accelerator;
    a memory having computer readable instructions; and
    a processor configured to execute the computer readable instructions, wherein the computer readable instructions, when executed by the processor, cause the accelerator to perform a method comprising:
        receiving a data stream comprising a first symbol;
        determining, based on the first symbol, a first symbol count having a first bit width, the first symbol count associated with an upper bound of a count range;
        determining a number of bits N based on the upper bound;
        generating an N-bit shift field based on the first symbol count;
        generating an M-bit mantissa based on the first symbol count, wherein M is equal to K–N, and wherein K comprises a total number of implemented bits;
        determining a second symbol count having a second bit width less than the first bit width by concatenating the N-bit shift field and the M-bit mantissa; and
        sorting a frequency of the second symbol count.

17. The system of claim 16, wherein the N-bit mantissa encodes the most significant non-zero bit and the next N−1 bits of the first symbol.

18. The system of claim 16, wherein the N-bit mantissa encodes the next N bits of the first symbol following the most significant non-zero bit.

19. The system of claim 16, wherein the data stream comprises an LZ77 compression output.

20. The system of claim 16, wherein determining the number of bits N comprises decreasing a number of many-to-one mappings by allocating extra bits to the M-bit mantissa.

* * * * *